US012046534B2

(12) United States Patent
Trivett et al.

(10) Patent No.: US 12,046,534 B2
(45) Date of Patent: Jul. 23, 2024

(54) STRUCTURAL AND THERMAL MANAGEMENT OF AN INTEGRATED CIRCUIT

(71) Applicant: Apple Inc., Cupertino, CA (US)

(72) Inventors: Simon J. Trivett, San Francisco, CA (US); Brett W. Degner, Menlo Park, CA (US); Mahesh S. Hardikar, San Jose, CA (US); Michael E. Leclerc, Mountain View, CA (US); Eric R. Prather, Portola Valley, CA (US); Kevin J. Ryan, Mountain View, CA (US)

(73) Assignee: Apple Inc., Cupertino, CA (US)

( * ) Notice: Subject to any disclaimer, the term of this patent is extended or adjusted under 35 U.S.C. 154(b) by 161 days.

(21) Appl. No.: 17/653,633

(22) Filed: Mar. 4, 2022

(65) Prior Publication Data

US 2023/0282544 A1  Sep. 7, 2023

(51) Int. Cl.
*H01L 23/40* (2006.01)
*G06F 1/20* (2006.01)
*H05K 1/02* (2006.01)
*H05K 7/20* (2006.01)

(52) U.S. Cl.
CPC .......... *H01L 23/4093* (2013.01); *G06F 1/206* (2013.01); *H05K 1/0203* (2013.01); *H05K 7/2039* (2013.01); *H05K 2201/10515* (2013.01)

(58) Field of Classification Search
CPC ... H01L 23/4093; G06F 1/206; H05K 1/0203; H05K 7/2039; H05K 2201/10515
See application file for complete search history.

(56) References Cited

U.S. PATENT DOCUMENTS

| 5,253,702 | A  | * | 10/1993 | Davidson | F28D 15/0266 29/890.032 |
| 6,169,659 | B1 |   | 1/2001  | Wheaton  | |
| 6,282,093 | B1 |   | 8/2001  | Goodwin  | |
| 6,343,643 | B1 | * | 2/2002  | Bollesen | H01L 23/427 257/E23.09 |
| 6,381,844 | B1 | * | 5/2002  | Bollesen | H05K 7/20318 165/185 |
| 7,755,912 | B2 | * | 7/2010  | Morita   | H05K 1/0231 361/803 |
| 7,777,329 | B2 |   | 8/2010  | Colbert et al. | |

(Continued)

FOREIGN PATENT DOCUMENTS

TW           201038114 A      10/2010

*Primary Examiner* — Michael A Matey
(74) *Attorney, Agent, or Firm* — BAKERHOSTETLER

(57) ABSTRACT

This application relates to modifications and enhancements to assemblies used with integrated circuits. In the described embodiments, multiple thermal components (e.g., vapor chambers, fin stacks, heat pipes) can be used to provide a dual-sided thermal energy extraction solution for a circuit board and an integrated circuit located on the circuit board. The thermal components can provide thermal energy dissipation capabilities for additional heat-generating components on the circuit board. Additionally, multiple plates can provide a compression force used to maintain contact between the integrated circuit and the circuit board, and in particular, between contact pads of the integrated circuit and pins, or springs, of a socket located on the circuit board.

19 Claims, 8 Drawing Sheets

(56) References Cited

U.S. PATENT DOCUMENTS

| | | | |
|---|---|---|---|
| 8,644,020 B2 | 2/2014 | Lau et al. | |
| 9,382,938 B2* | 7/2016 | Hayashi | H01L 23/4006 |
| 9,414,481 B1* | 8/2016 | Tu | H05K 1/0203 |
| 10,147,665 B2 | 12/2018 | Park et al. | |
| 10,354,979 B1 | 7/2019 | Faoro | |
| 10,616,993 B1* | 4/2020 | Gawlowski | H05K 1/0203 |
| 2005/0068740 A1* | 3/2005 | Ulen | H01L 23/4006 |
| | | | 257/E23.087 |
| 2005/0117305 A1* | 6/2005 | Ulen | H01L 23/4006 |
| | | | 257/E23.084 |
| 2005/0286229 A1* | 12/2005 | Ku | H01L 23/427 |
| | | | 361/709 |
| 2006/0146500 A1* | 7/2006 | Yatskov | H01L 23/427 |
| | | | 257/E23.099 |
| 2006/0185836 A1 | 8/2006 | Garner | |
| 2006/0215383 A1* | 9/2006 | Unrein | H01L 23/4006 |
| | | | 361/810 |
| 2007/0097653 A1* | 5/2007 | Gilliland | H01L 23/552 |
| | | | 257/E23.114 |
| 2014/0239488 A1* | 8/2014 | Kobayashi | H01L 23/367 |
| | | | 257/718 |
| 2015/0327353 A1* | 11/2015 | Dickover | H01L 23/4338 |
| | | | 29/890.03 |
| 2020/0359525 A1* | 11/2020 | Eto | H01L 23/42 |
| 2020/0411410 A1* | 12/2020 | Klein | H01L 23/427 |
| 2021/0193557 A1* | 6/2021 | Yao | H01R 13/639 |
| 2021/0208647 A1* | 7/2021 | Macias | G06F 1/184 |
| 2023/0180432 A1* | 6/2023 | Lunsman | H05K 7/20254 |
| | | | 361/699 |

* cited by examiner

STRUCTURAL AND THERMAL MANAGEMENT OF AN INTEGRATED CIRCUIT

FIELD

The described embodiments relate generally to management of an integrated circuit on a circuit board. More particularly, the present embodiments relate to maintaining contact between an integrated circuit and a circuit board under both increased bending moments and increased thermal needs.

BACKGROUND

Recent advances in portable computing devices offer enhanced performance. This includes, for example, integrated circuits operating at higher operating frequencies (i.e., faster processing speeds). However, by operating at a higher frequency, an integrated circuit may generate additional thermal energy. In order to limit performance of and/or prevent damage to the integrated circuit, thermal energy should be substantially extracted and drawn away from the integrated circuit and a circuit board to which the integrated circuit is connected.

Additionally, in order to increase the number of operations, an integrated circuit may increase in terms of the overall size/footprint. As a result, additional contacts, or pads, may be added to the integrated circuit, which may lead to additional challenges in maintaining electrical connections between respective contacts on the integrated circuit and pins on a socket.

SUMMARY

This paper describes various embodiments that relate to maintaining electrical contact between an integrated circuit and a circuit board while accounting for bending moments and thermal energy dissipation needs.

In some embodiments of the present disclosure, an electronic device is described. The electronic device may include a housing that defines an internal volume. The electronic device may further include components located in the internal volume. The components may include a circuit board. The components may further include an integrated circuit located on the circuit board. The components may further include a first plate. The components may further include a second plate. In some embodiments, the first plate and the second plate provide a force that maintains a coupling between the integrated circuit and the circuit board.

In some embodiments of the present disclosure, an electronic device is described. The electronic device may include a first thermal component. The first thermal component may include a holder. The first thermal component may further include a biasing component. In this regard, the holder and the bias component may not act specifically as thermal components but may be carried within the first thermal component. The electronic device may further include a circuit board that includes a socket. The electronic device may further include an integrated circuit electrically coupled with the socket. The integrated circuit may be thermally coupled with the first thermal component. The electronic device may further include a second thermal component thermally coupled to the circuit board. The electronic device may further include a plurality of plates coupled with the holder by a fastener. The plurality of plates may provide a compression force, based on the fastener and the biasing component, to the integrated circuit and the circuit board.

In some embodiments of the present disclosure, an assembly for an integrated circuit is described. The assembly may include a first fin stack. The first fin stack may include a holder. The first fin stack may further include a biasing component. The assembly may further include a circuit board that includes a socket that carries the integrated circuit. The integrated circuit may be thermally coupled with the first fin stack. The assembly may further include a second fin stack thermally coupled to the circuit board. The assembly may further include a plurality of plates coupled with the holder by a fastener, the plurality of plates providing a compression force, based on the fastener and the biasing component, to the integrated circuit and the circuit board.

Other aspects and advantages of the invention will become apparent from the following detailed description taken in conjunction with the accompanying drawings which illustrate, by way of example, the principles of the described embodiments.

This Summary is provided merely for purposes of summarizing some example embodiments so as to provide a basic understanding of some aspects of the subject matter described herein. Accordingly, it will be appreciated that the above-described features are merely examples and should not be construed to narrow the scope or spirit of the subject matter described herein in any way. Other features, aspects, and advantages of the subject matter described herein will become apparent from the following Detailed Description, Figures, and Claims.

BRIEF DESCRIPTION OF THE DRAWINGS

The disclosure will be readily understood by the following detailed description in conjunction with the accompanying drawings, wherein like reference numerals designate like structural elements.

DETAILED DESCRIPTION

Figure 1:
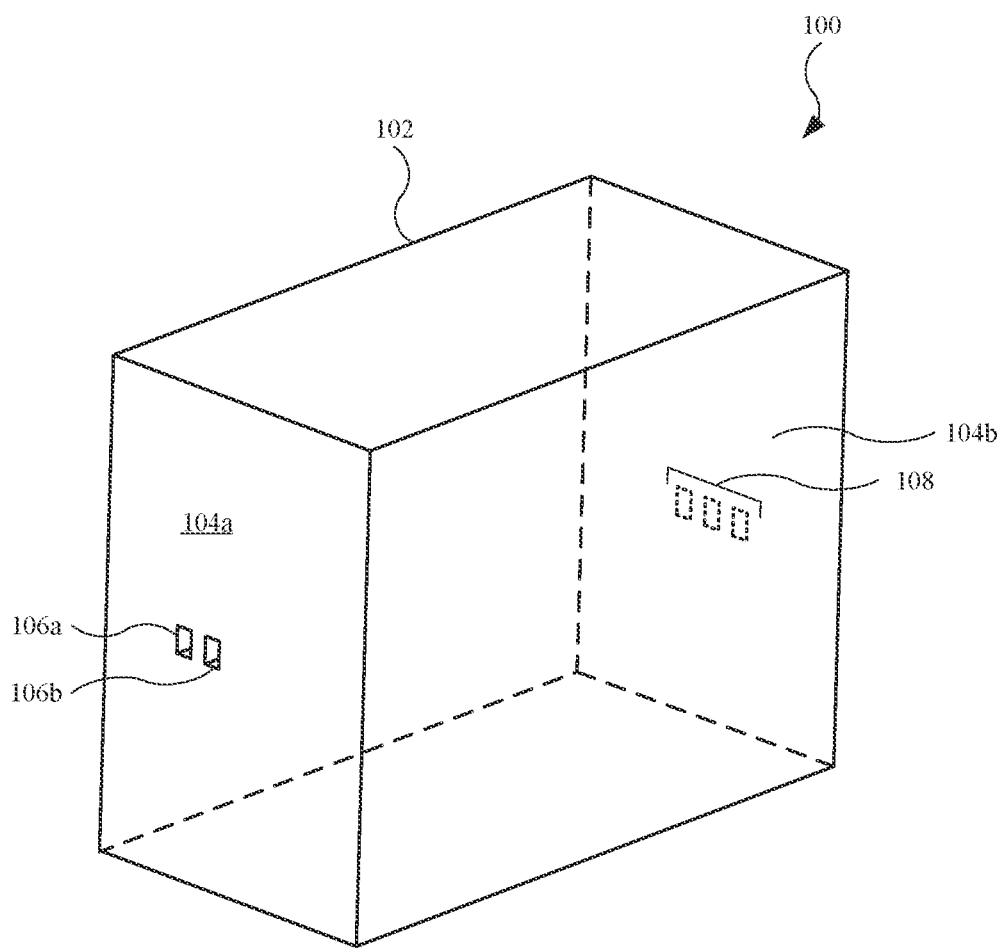
FIG. 1 illustrates an isometric view of an embodiment of an electronic device.

Representative applications of methods and apparatus according to the present application are described in this section. These examples are being provided solely to add context and aid in the understanding of the described embodiments. It will thus be apparent to one skilled in the art that the described embodiments may be practiced without some or all of these specific details. In other instances, well known process steps have not been described in detail in order to avoid unnecessarily obscuring the described embodiments. Other applications are possible, such that the following examples should not be taken as limiting.

In the following detailed description, references are made to the accompanying drawings, which form a part of the description and in which are shown, by way of illustration, specific embodiments in accordance with the described embodiments. Although these embodiments are described in sufficient detail to enable one skilled in the art to practice the described embodiments, it is understood that these examples are not limiting; such that other embodiments may be used, and changes may be made without departing from the spirit and scope of the described embodiments.

This application is directed to modifications and enhancements to address structural and thermal needs for heat-generating components (e.g., integrated circuits) in electronic devices. Electronic devices described herein may refer to desktop computing devices, laptop computing devices, mobile wireless communication devices (e.g., smartphones, tablet computing devices), and display devices (e.g., computing devices with displays, standalone displays), as non-limiting examples. During operation, an integrated circuit (e.g., system on chip, or SOC) in an electronic device generates thermal energy (i.e., heat). Additionally, electrical and mechanical connections between the integrated circuit and a socket, located on a circuit board, should be maintained to ensure proper operation of the integrated circuit.

In order to address thermal issues, electronic devices described herein may include multiple thermal components surrounding the integrated circuit and the circuit board. In this detailed description and in the claims, a "thermal component" may refer to a device designed to absorb or extract thermal energy from a heat-generating component. For example, a thermal component may include a thermal extraction component, a heat transport component, or a thermally conductive component, as non-limiting examples. Examples of thermal extraction components and heat transfer components include a vapor chamber and a heat pipe. Examples of thermally conductive components include a metal, or metal alloy, that relies on its intrinsic properties (i.e., relatively high thermal conductivity) to absorb thermal energy. Copper is an exemplary metal used with a thermally conductive component. Additional examples of thermal components include heat sinks that absorb thermal energy and allow a fluid (e.g., air) to pass through its surfaces. A fin stack is an example of a heat sink.

In some embodiments, a vapor chamber is thermally coupled to the integrated circuit by way of contact with the integrated circuit, or a lid/cover of the integrated circuit. Additionally, in some embodiments, a vapor chamber is thermally coupled to the circuit board and at least some components positioned on the circuit board (e.g., voltage regulators). Collectively, the thermal components (i.e., vapor chambers) can surround the integrated circuit and the circuit board, thus providing a dual-sided thermal energy extraction solution to multiple areas of the combined integrated circuit and circuit board.

Additional thermal components can be used. For example, in some embodiments, one or more heat pipes are thermally coupled to one of the vapor chambers. Further, a fin stack can be integrated and used as a heat sink for the heat pipe(s). Also, an additional fin stack can be integrated and used as a heat sink for the additional vapor chamber.

In order to address structural issues, electronic devices described herein may also include one or more plates, or structural stages, used to provide a force to the integrated circuit and the circuit board. For example, in some embodiments, a plate is position over one of the vapor chambers, and an additional plate is positioned below the circuit board. External forces applied to each of the plates can direct the plates toward each other, thereby providing a compression force to the integrated circuit and the circuit board. In this regard, a thermal component (e.g., the fin stack) that is thermally coupled to the vapor chamber includes multiple modules, with each module including a biasing component (e.g., spring) and a holder (e.g., a nut, including a threaded nut). Further, when fasteners (used to secure one of the plates) are each coupled with a respective holder (e.g., through a threaded engagement), the resulting compression force provided by the fasteners and the springs provides an increased contact force between the integrated circuit and the circuit board such that the contacts on the integrated circuit engage respective pins (or springs) on the socket that carries the integrated circuit. A "compression force" described in the detailed description and in the claims may not individually compress the integrated circuit or the circuit board, but rather prevent separation between the integrated circuit and the circuit board, thus minimizing the overall volume of the integrated circuit and the circuit board. However, the compression force described herein may bend the pins/springs located on the socket. Also, by integrating the modules with the fin stack, the airflow blockage is minimized, thereby allowing airflow over and around the circuit board and the components carried by the circuit board.

The plates are made from one or more materials that include a relatively high modulus. For example, the plates may include steel plates. As a result, the plates generally resist bending/bowing due to external forces provided by fasteners at the corners and/or edges of the plates. The high-modulus properties prevent bending due to higher compression forces provided by the combination of spring forces provided by the biasing components and/or additional tightening between the fasteners and the biasing components (e.g., clockwise rotation of the fastener). By maintaining flat, or planar, surfaces, the plates provide a consistent force with even pressure to the integrated circuit and the circuit board, which prevents the integrated circuit and the circuit board from bending/bowing. As a result, the integrated circuit remains flat (or at least substantially flat) and its contacts remain engaged with respective pins on the socket. Further, the plates and thermal components can be used with relatively larger integrated circuits that require larger sockets with additional pins. Accordingly, larger integrated circuits, which may carry out additional operations and provide more advanced computing capabilities (e.g., faster processing speeds), can be used based on the advantages described herein.

Also, when the circuit board includes multiple surfaces (i.e., opposing surfaces of the circuit board) that carry components, the thermal components and the plates can provide thermal energy extraction and compression forces between the additional components and the circuit board. For example, in some embodiments, the circuit board carries voltage regulators on a surface opposite the surface that carries the integrated circuit. At least one of the vapor chambers can extract thermal energy generated by the voltage regulators and the plates can provide a compression force, if needed, to maintain contact (i.e., electrical and mechanical) between the voltage regulators and the circuit board. Alternatively, one of the plates may include indentations having a shape corresponding to a combined shape of the voltage regulators, thereby accommodating and providing space for the voltage regulators, thus minimizing the compression force to the voltage regulators.

These and other embodiments are discussed below with reference to FIGS. 1-7; however, those skilled in the art will readily appreciate that the detailed description given herein with respect to these figures is for explanatory purposes only and should not be construed as limiting.

FIG. 1 illustrates an isometric view of an embodiment of an electronic device 100. Electronic device 100 may include a desktop computing device, including a personal desktop computing device. However, in other embodiments, electronic device 100 may take the form of various computing devices, such as a laptop computing device, a mobile wireless communication device, a tablet computing device, or a display device, as non-limiting examples.

Electronic device 100 includes a housing 102, or enclosure, that provides an internal volume (or storage location) for several internal components of electronic device 100. As non-limiting examples, housing 102 may store a central processing unit ("CPU"), graphics processing unit ("GPU"), additional processing circuitry, memory circuitry, wired and wireless communication components, and flexible circuitry to connect at least some of the components. Housing 102 may include a metal housing, composed of aluminum, stainless steel, or a metal alloy. Housing 102 may alternatively be formed from one or more non-metals. As shown, housing 102 includes a surface 104a that provides an area for several input/output ("I/O") ports. For example, electronic device 100 includes an I/O port 106a and an I/O port 106b. Each of I/O ports 106a and 106b may include a particular I/O port, such as Universal Serial Bus ("USB"), solid state drive ("SSD") port, Ethernet, a High-Definition Multimedia Interface ("HDMI") port, or a power input port, as non-limiting examples. Although I/O ports 106a and 106b are shown as a discrete number, I/O ports 106a and 106b may represent several additional I/O ports. Further, housing 102 includes a surface 104b that provides an area for I/O ports 108. I/O ports 108 may each include any type of port previously described for I/O ports 106a and 106b.

Figure 2:
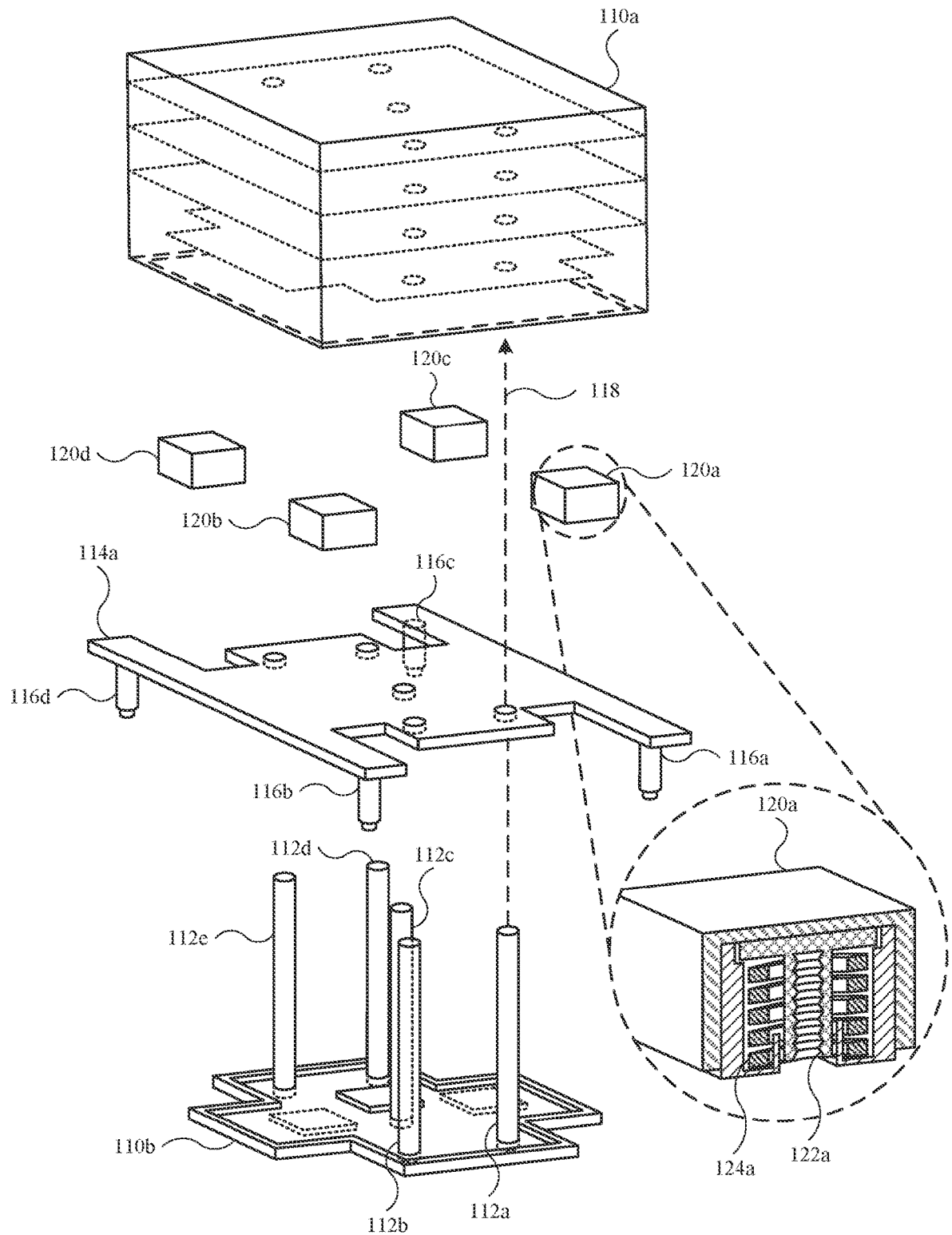
FIG. 2 illustrates an exploded view of several components for use in the electronic device, in accordance with some described embodiments.

FIG. 2 illustrates an exploded view of several components for use in electronic device 100, in accordance with some described embodiments. The components shown and described in FIG. 2 may be located within housing 102 of electronic device 100 (shown in FIG. 1). For example, at least some of the components are thermal components used to cool heat-generating components on a circuit board, such as integrated circuits, voltage regulators, and other components located on the circuit board. Also, at least some components are used to provide a force used to maintain electrical and mechanical contact between an integrated circuit and a circuit board. These features will be shown and described in further detail below.

As shown, the components include a thermal component 110a. In some embodiments, thermal component 110a includes a fin stack. Also, the components include a thermal component 110b. In some embodiments, thermal component 110b includes a vapor chamber. Thermal component 110b may include several pipes. For example, thermal component 110b includes a pipe 112a, a pipe 112b, a pipe 112c, a pipe 112d, and a pipe 112e. Pipes 112a, 112b, 112c, 112d, and 112e may act as heat pipes. In this manner, pipes 112a, 112b, 112c, 112d, and 112e are designed to carry thermal energy received by thermal component 110b and transport the thermal energy to thermal component 110a. As shown, pipes 112a, 112b, 112c, 112d, and 112e are integrated with thermal component 110b to form a single-piece structure. However, in other embodiments, pipes 112a, 112b, 112c, 112d, and 112e are separate structures connected to thermal component 110b.

Additionally, the components include a plate 114a. Plate 114a is designed to provide, in conjunction with another plate, a force that maintains contact (i.e., electrical and mechanical contact) between an integrated circuit and a circuit board. This will be shown and described below. Plate 114a may include a stiff material (or materials), giving plate 114a a relatively high modulus. For example, plate 114a may include steel. Plate 114a includes several openings, or through holes, each designed to receive a respective pipe of pipes 112a, 112b, 112c, 112d, and 112e. In this manner, each of pipes 112a, 112b, 112c, 112d, and 112e pass through a respective opening of plate 114a and into one or more openings in layers (shown as dotted lines) disposed in thermal component 110a. As an example of an assemble configuration, an arrow 118 shows the path of pipe 112a through an opening of plate 114a, and further in the direction of openings (not labeled) of thermal component 110a. Also, the assembled configuration further places plate 114a between thermal components 110a and 110b. Further, plate 114a and thermal component 110b may be secured together by solder or thermally conductive adhesives, as non-limiting examples.

In order to secure additional components, plate 114a includes several posts. For example, plate 114a includes a post 116a, a post 116b, a post 116c, and a post 116d. Posts 116a, 116b, 116c, and 116d can secure components, such as a circuit board, a socket, and/or an additional thermal component. This will be shown and described below. Additionally, several modules may be used to secure components. For example, a module 120a, a module 120b, a module 120c, and a module 120d are shown. When assembled, modules 120a, 120b, 120c, and 120d can be disposed, or otherwise positioned, on plate 114a, and be disposed within thermal component 110a.

As shown in the enlarged view, module 120a includes a holder 122a, which can be used as a nut (including a threaded nut). Holder 122a is designed to receive (e.g., by threaded engagement) a fastener (not shown in FIG. 2). Additionally, module 120a include a biasing component 124a, which may take the form of a spring. When holder 122a secures a fastener, biasing component 124a may compress and provide a counterforce, based on its spring constant, to plate 114a. It should be noted that modules 120b, 120c, and 120d may include any features and components shown and described for module 120a.

Figure 3:
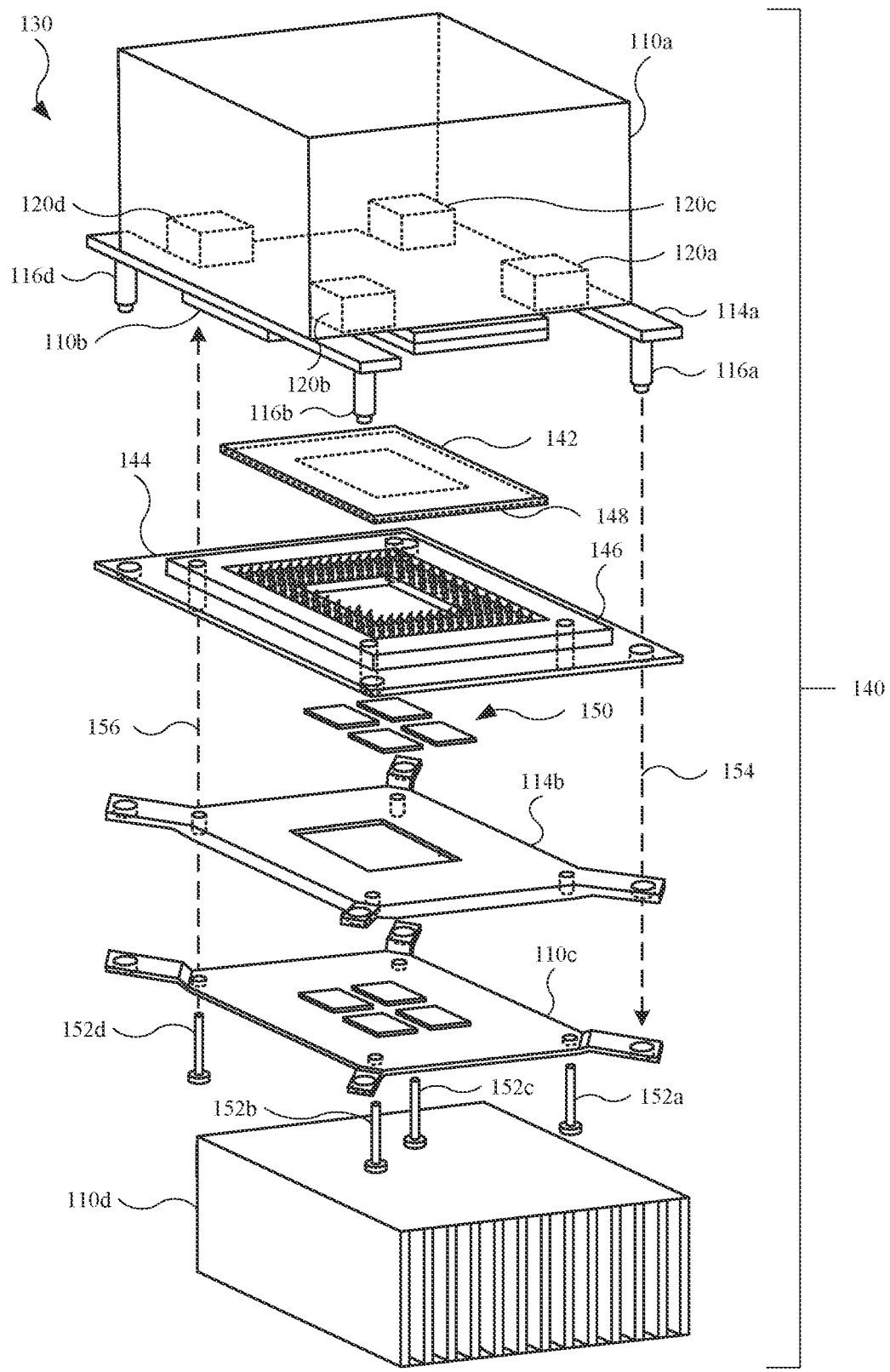
FIG. 3 illustrates an exploded view of additional components used with the components shown in FIG. 2, in accordance with some described embodiments.

FIG. 3 illustrates an exploded view of additional components used with the components shown in FIG. 2, in accordance with some described embodiments. The components shown in FIG. 2 are combined to define a sub-assembly 130. Sub-assembly 130 and other components shown in FIG. 3 may combine to form an assembly 140 of additional components. For example, assembly 140 may include an integrated circuit 142. In some embodiments, integrated circuit 142 includes an SOC used to integrate several components of electronic device 100. Accordingly, integrated circuit 142 may serve as a CPU, as a non-limiting example. However, integrated circuit 142 may take the form of other processing circuit(s) in other embodiments. When assembled, thermal component 110b is thermally coupled to integrated circuit 142 by, for example, contact between thermal component 110b and integrated circuit 142, or by contact between thermal component 110b and a lid of integrated circuit 142. Assembly 140 further includes a circuit board 144, which may take the form of a printed circuit board (as a non-limiting example). Circuit board 144 includes a socket 146 with several pins (shown, not labeled), or springs. Socket 146 may define a land grid array ("LGA").

Referring again to integrated circuit 142, integrated circuit 142 may include a surface 148 (shown as dotted lines) that faces socket 146. Surface 148 represents a location that carries several, discrete electrically conductive (i.e., metal-based) contact pads designed to make electrical and mechanical contact with a respective pin of socket 146 when integrated circuit 142 is positioned in socket 146. The electrical contact between the contact pads and the pins places integrated circuit 142 in electrical communication with circuit board 144. Alternatively, in some embodiments, integrated circuit 142 defines a pin grid array ("PGA") and as a result, socket 146 includes several openings for each of the pins of the PGA.

Circuit board 144 may carry additional components on a surface opposite to the surface on which socket 146 lies. For example, voltage regulators 150 may be positioned on, and electrically coupled to, circuit board 144. Voltage regulators 150 are designed to control voltage to components, such as integrated circuit 142. In order to electrically couple with voltage regulators 150, circuit board 144 may include a power distribution network ("PDN") that includes interconnects between voltage regulators 150 and integrated circuit 142. While a discrete number of voltage regulators 150 is shown, voltage regulators 150 may include one or more voltage regulators.

Assembly 140 may further include a plate 114b. When assembly 140 is assembled, plates 114a and 114b provide a force, collectively, that maintains contact between integrated circuit 142 and circuit board 144, and in particular, between contact pads of integrated circuit 142 and pins of socket 146.

Assembly 140 may further include a thermal component 110c. In some embodiments, thermal component 110c includes a vapor chamber. Thermal component 110c can be thermally coupled to circuit board 144 and at least some components carried by circuit board 144. Accordingly, thermal component 110c can extract thermal energy from circuit board 144 and at least some components carried by circuit board 144. Also, assembly 140 may further include a thermal component 110d. In some embodiments, thermal component 110c includes a fin stack. Thermal component 110d can be thermally coupled to thermal component 110c, and accordingly, can dissipate thermal energy from thermal component 110c. Thermal components 110c and 110d may be secured together by solder or thermally conductive adhesives, as non-limiting examples.

To align and/or secure several components together, each of posts 116a, 116b, 116c (shown in FIG. 2), and 116d pass through a respective opening, or through hole, of circuit board 144, plate 114b, and thermal component 110c. As an example, an arrow 154 shows the path of post 116a through respective openings (not labeled) of circuit board 144, plate 114b, and thermal component 110c, where a securing element (e.g., nut) can be secured to post 116a.

To further secure several components together, assembly 140 may further include fasteners. For example, assembly 140 may include a fastener 152a, a fastener 152b, a fastener 152c, and a fastener 152d. Each of fasteners 152a, 152b, 152c, and 152d passes through respective openings, or through holes, of circuit board 144, socket 146, plate 114b, and thermal component 110c. Also, each of fasteners 152a, 152b, 152c, and 152d are designed to secure within modules 120a, 120b, 120c, and 120d, respectively. In this regard, 120a, 120b, 120c, and 120d modules include a holder (see holder 122a, in FIG. 2) designed to engage one of fasteners 152a, 152b, 152c, and 152d by, for example, a threaded engagement. In this manner, fasteners 152a, 152b, 152c, and 152d may include threaded fasteners. As an example, an arrow 156 shows the path of fastener 152d through respective openings (not labeled) of thermal component 110c, plate 114b, circuit board 144, socket 146, and subsequently into module 120d.

Figure 4:
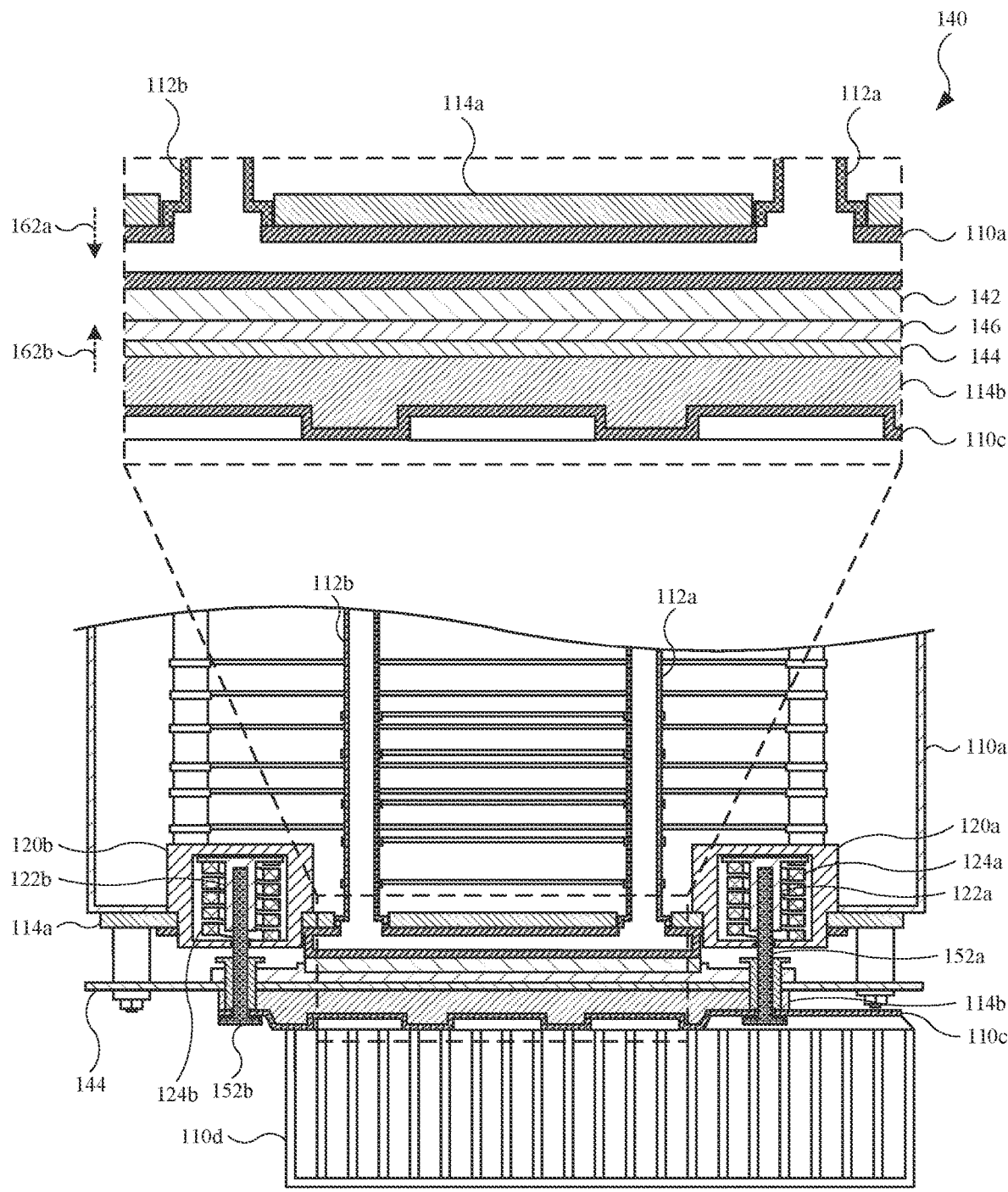
FIG. 4 illustrates a partial cross-sectional view of the components of assembly assembled together, in accordance with some described embodiments.

FIG. 4 illustrates a partial cross-sectional view of the components of assembly 140 assembled together, in accordance with some described embodiments. As shown, fasteners 152a and 152b are secured with modules 120a and 120b, respectively, and in particular, with holders 122a and 122b, respectively. Based on this secured engagement between the aforementioned fasteners and holders, biasing components 124a and 124b, located in modules 120a and 120b, respectively, compress. However, based on their tendency to return to their uncompressed form, biasing components 124a and 124b provide a counterforce that is applied to plate 114a, causing plate 114a to apply a force to thermal component 110a. At least some of this force is transferred to integrated circuit 142. As shown in the enlarged view, an arrow 162a indicates a primary direction of force provided by biasing components 124a and 124b to integrated circuit 142 by way of plate 114a. Moreover, fasteners 152a and 152b provide a force to plate 114b, at least some of which is transferred to circuit board 144. The force can be adjusted (i.e., increased or decreased) by rotating fasteners 152a and 152b in a clockwise or counterclockwise direction to adjust the engagement with holders 122a and 122b, respectively. An arrow 162b indicates a primary direction of force provided by fasteners 152a and 152b to circuit board 144. Based on the direction of arrows 162a and 162b, it can be seen that the forces are directed toward each other. Accordingly, plates 114a and plates 114b collectively provide a compression force that maintains contact between integrated circuit 142 and socket 146, and in particular, between the contact pads and pins of integrated circuit 142 and socket 146, respectively (described in FIG. 3). Fasteners 152c and 152d can be secured with modules 120c and 120d, respectively, both shown in FIG. 3, in a similar manner.

Based on their respective properties (i.e., material makeup, thickness, as non-limiting examples), plates 114a and 114b are designed to withstand bending moments and bowing from external forces and stresses. In this regard, when an external force is applied to plates 114a and 114b, plates 114a and 114b remain flat (or at least substantially flat) and provide a generally even force with consistent pressure across their respective bodies. As a result, the contact pads and pins of integrated circuit 142 and socket 146, respectively, remain in electrical and mechanical contact.

The assembled configuration of assembly 140 further illustrates the thermal relationships. For examples, pipes 112a and 112b (representative of additional pipes) are thermally coupled to thermal component 110b, which is thermally coupled to integrated circuit 142. As a result, pipes 112a and 112b can transport thermal energy generated by integrated circuit 142 and received/extracted by thermal component 110b to thermal component 110a, where the transported thermal energy can be distributed throughout thermal component 110a. Additionally, thermal component 110c is thermally coupled to circuit board 144, and may be thermally coupled to at least some other components on circuit board 144 (e.g., voltage regulators 150, shown in FIG. 3). As a result, thermal component 110c can receive/extract thermal energy generated by at least voltage regulators 150 and transport the thermal energy to thermal component 110d, where the transported thermal energy can be distributed throughout thermal component 110d.

Figure 5A:
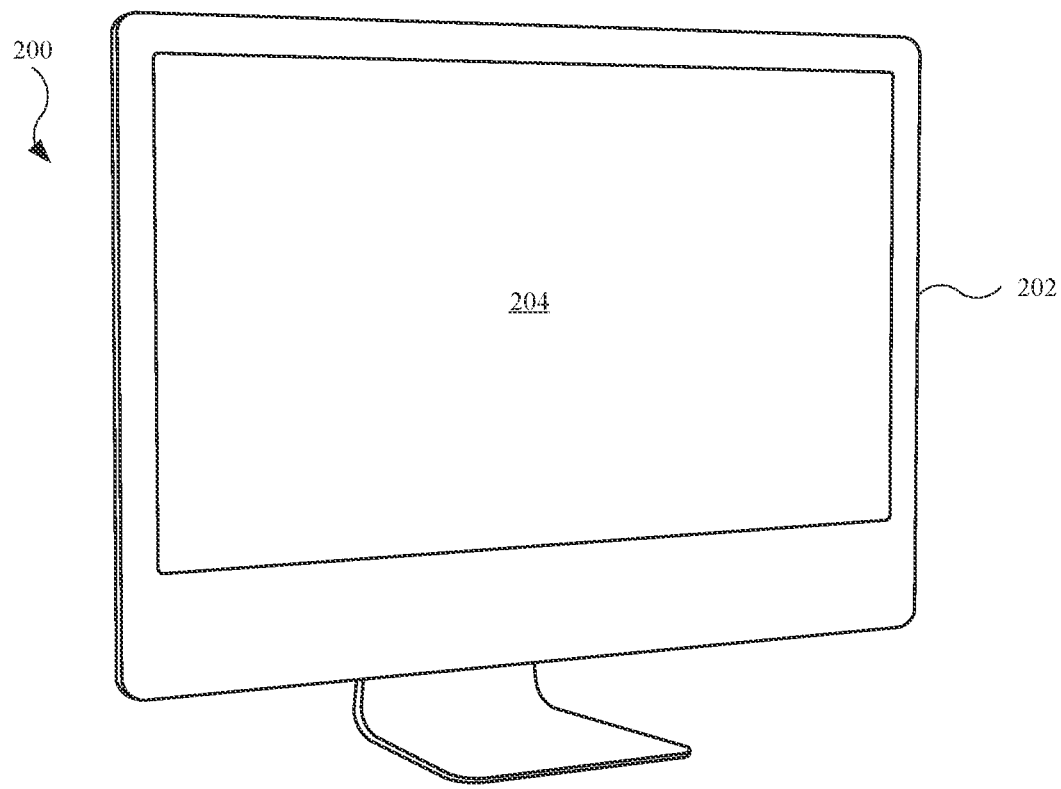
FIGS. 5A-5C illustrate alternate embodiments of electronic devices that may include internal components described herein.
Figure 5B:
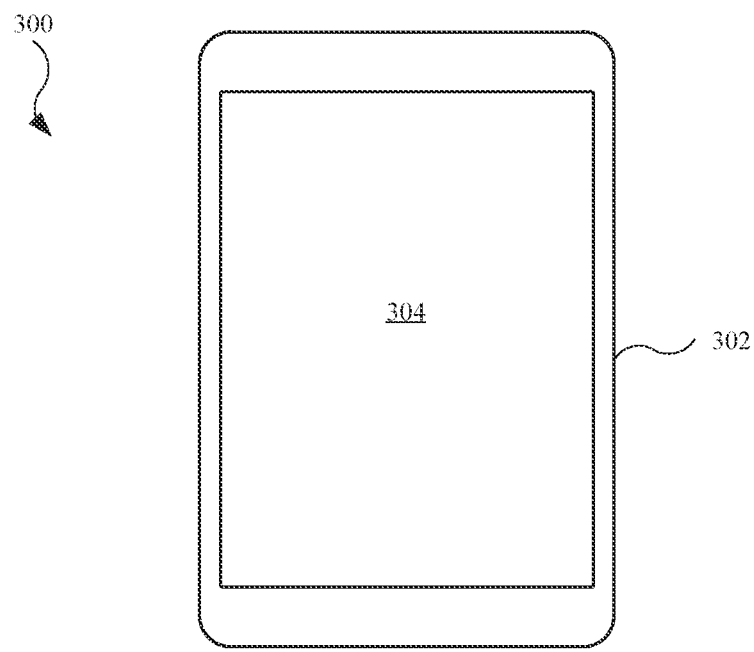
Figure 5C:
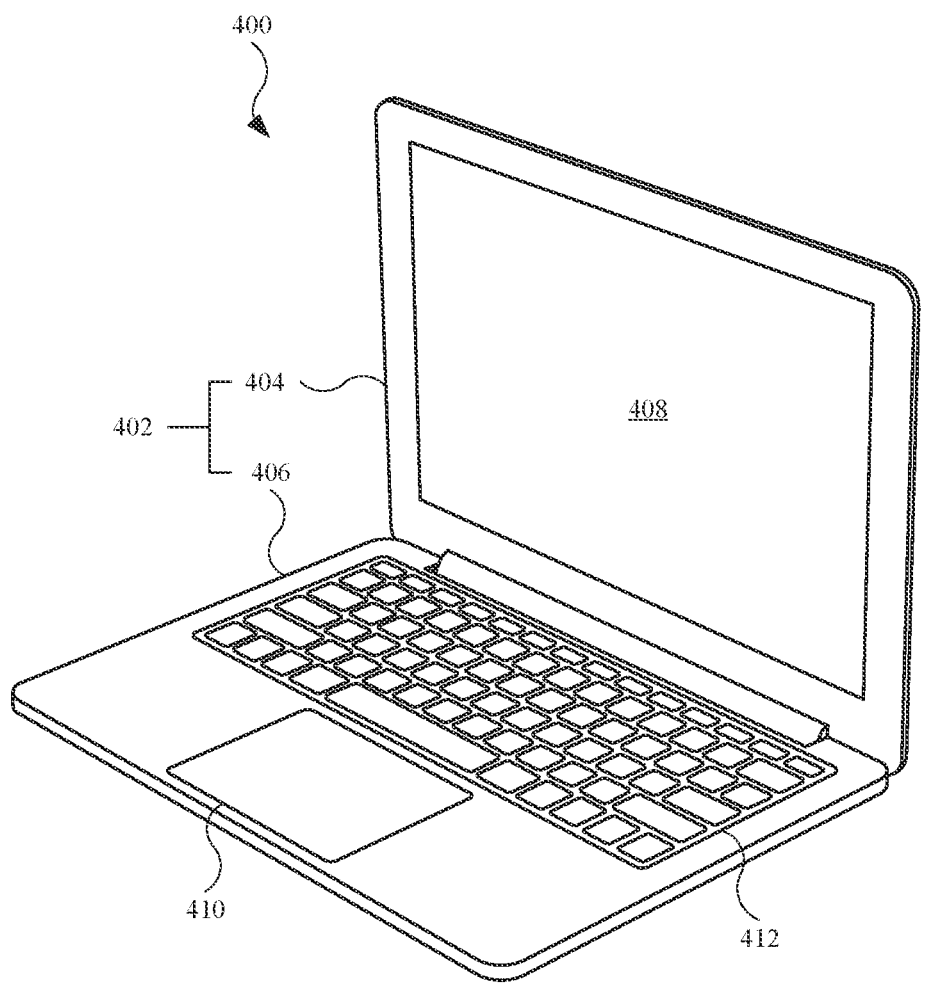

FIGS. 5A-5C illustrate alternate embodiments of electronic devices that may include internal components described herein. FIG. 5A illustrates an isometric view of an alternate embodiment of an electronic device 200 that can take the form of a standalone display or a desktop computer with a display. As shown, electronic device 200 includes a housing 202 and a display 204 coupled to housing 202. Housing 202 can define an internal volume to carry one or more components described herein for electronic devices. Also, although not shown, electronic device 200 may work in conjunction (wired or wireless) with accessories, such as a mouse and a keyboard. Although not shown, electronic device 200 may further include one or more I/O features (e.g., buttons, switches, ports).

FIG. 5B illustrates a plan view of an alternate embodiment of an electronic device 300 that can take the form of a mobile wireless communication device (e.g., smartphone) or a tablet computing device. As shown, electronic device 300 includes a housing 302 and a display 304 coupled to housing 302. Housing 302 can define an internal volume to carry one or more components described herein for electronic devices. Although not shown, electronic device 300 may further include one or more I/O features (e.g., buttons, switches, docks/ports) and display 304 may include a capacitive touch input display.

FIG. 5C illustrates a plan view of an alternate embodiment of an electronic device 400 that can take the form of a laptop computing device. As shown, electronic device 400 includes a housing 402 that includes a display housing 404 and a base portion 406 rotationally coupled to display housing 404. Also, display housing 404 carries a display 408, and base portion 406 includes a track pad 410 and a keyboard 412, both of which can be used as inputs. Housing 402 can define an internal volume to carry one or more components described herein for electronic devices. Although not shown, electronic device 400 may further include one or more I/O features (e.g., buttons, switches, docks/ports).

Figure 6:
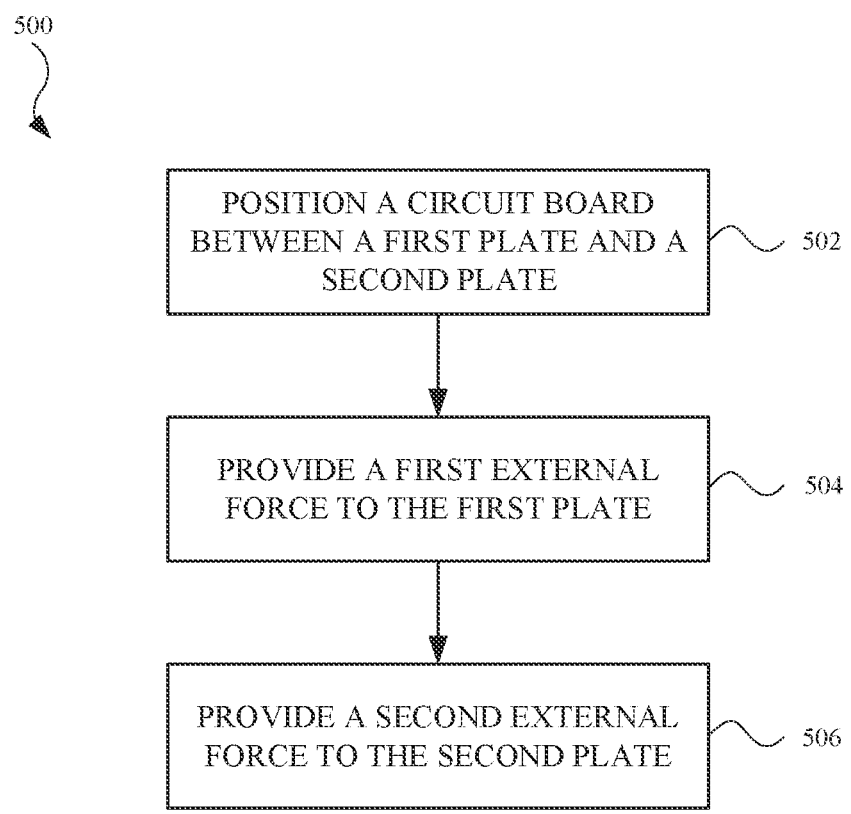
FIG. 6 illustrates a flowchart showing a method for supporting an integrated circuit, in accordance with some described embodiments.

FIG. 6 illustrates a flowchart 500 showing a method for supporting an integrated circuit, in accordance with some described embodiments. Flowchart 500 shows and describes several steps used to form, for example, an assembly described herein. Also, electronic devices described herein may incorporate an assembly formed by flowchart 500. Further, it should be noted that some, but not all, steps of flowchart 500 may be used to form an assembly. Accordingly, some steps may be optional.

In step 502, a circuit board is positioned between a first plate and a second plate. The circuit board carries the integrated circuit. In some embodiments, the circuit board includes a socket that includes several pins, each of which makes electrical and mechanical contact with respective contact pads on the integrated circuit.

In step 504, a first external force is provided to the first plate. In some embodiments, one or more fasteners are coupled to one or more modules, respectively. Further, each module includes a biasing component such that when the fastener(s) is/are coupled to the module(s), the biasing component(s) provide the first external force to the first plate.

In step 506, a second external force is provided to the second plate. In some embodiments, the resultant coupling between the fastener(s) is/are coupled to the module(s) can provide the second force to the second plate. For example, the fastener(s) can couple with the second plate and provide the second external force. The first external force and the second external force provided to the first plate and the second plate, respectively, causes the integrated circuit to remain electrically and mechanically coupled with the circuit board. In particular, the first external force and the second external force cause each of the contact pads of the integrated circuit to remain in physical contact with a respective pin on the socket, thereby maintaining an electrical and mechanical coupling between the integrated circuit and the circuit board.

Although not explicitly shown, flowchart 500 may include steps to provide additional functions and features. For example, some additional steps may include incorporating one or more thermal components, such as vapor chambers, heat pipes, fin stacks, as non-limiting examples. Further, the one or more thermal components may be located on both sides of the combination of the integrated circuit and the circuit board.

Figure 7:
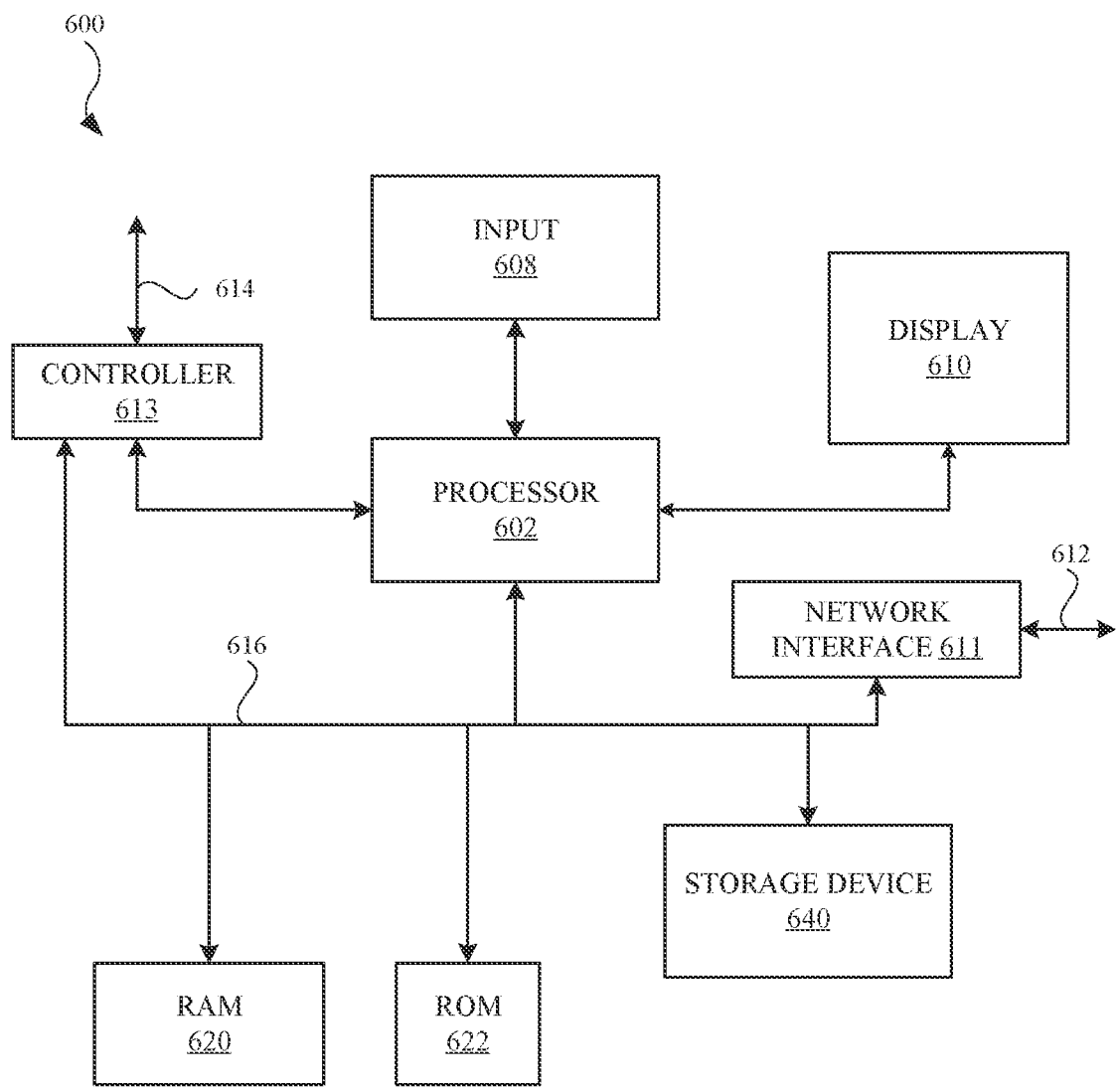
FIG. 7 illustrates a block diagram of an electronic device, in accordance with some described embodiments.

FIG. 7 illustrates a block diagram of an electronic device 600, in accordance with some described embodiments. The details shown for electronic device 600 can be used to implement the various techniques described herein, according to some embodiments. In particular, FIG. 7 shows components that can be included in electronic devices described herein. As shown in FIG. 7, electronic device 600 can include a processor 602 that represents a microprocessor or controller for controlling the overall operation of electronic device 600. Electronic device 600 can also include a user input device 608 that allows a user of electronic device 600 to interact with electronic device 600. For example, user input device 608 can take a variety of forms, such as a button, keypad, dial, touch screen, audio input interface, visual/image capture input interface, input in the form of sensor data, and so on. Still further, electronic device 600 can include a display 610 that can be controlled by processor 602 (e.g., via a graphics component) to display information to the user. A data bus 616 can facilitate data transfer between at least a storage device 640, processor 602, and a controller 613. Controller 613 can be used to interface with and control different equipment through an equipment control bus 614. Electronic device 600 can also include a network/bus interface 611 that couples to a data link 612. In the case of a wireless connection, network/bus interface 611 can include a wireless transceiver.

As noted above, electronic device 600 also includes storage device 640, which may include a single disk or a collection of disks (e.g., hard drives). In some embodiments, storage device 640 can include flash memory, semiconductor (solid state) memory or the like. Electronic device 600 can also include a Random-Access Memory (RAM) 620 and a Read-Only Memory (ROM) 622. ROM 622 can store programs, utilities or processes to be executed in a non-volatile manner. RAM 620 can provide volatile data storage, and stores instructions related to the operation of applications executing on electronic device 600.

The various aspects, embodiments, implementations or features of the described embodiments can be used separately or in any combination. Various aspects of the described embodiments can be implemented by software, hardware or a combination of hardware and software. The described embodiments can also be embodied as computer readable code on a non-transitory computer readable medium. The non-transitory computer readable medium is any data storage device that can store data which can thereafter be read by a computer system. Examples of the non-transitory computer readable medium include read-only memory, random-access memory, CD-ROMs, HDDs, DVDs, magnetic tape, and optical data storage devices. The non-transitory computer readable medium can also be distributed over network-coupled computer systems so that the computer readable code is stored and executed in a distributed fashion.

The foregoing description, for purposes of explanation, used specific nomenclature to provide a thorough understanding of the described embodiments. However, it will be apparent to one skilled in the art that the specific details are not required in order to practice the described embodiments. Thus, the foregoing descriptions of specific embodiments are presented for purposes of illustration and description. They are not intended to be exhaustive or to limit the described embodiments to the precise forms disclosed. It will be apparent to one of ordinary skill in the art that many modifications and variations are possible in view of the above teachings.

It is well understood that the use of personally identifiable information should follow privacy policies and practices that are generally recognized as meeting or exceeding industry or governmental requirements for maintaining the privacy of users. In particular, personally identifiable information data should be managed and handled so as to minimize risks of unintentional or unauthorized access or use, and the nature of authorized use should be clearly indicated to users.

What is claimed is:

1. An electronic device, comprising:
   a circuit board;
   an integrated circuit located on the circuit board;
   a first plate;
   a second plate, wherein the first plate and the second plate provide a force that maintains a coupling between the integrated circuit and the circuit board;
   a thermal component coupled with the first plate;
   a module located within the thermal component, the module comprises a holder and a biasing component; and
   a heat pipe that passes through the first plate and into the thermal component.

2. The electronic device of claim 1, further comprising a socket electrically connected to the circuit board, wherein the coupling comprises a mechanical coupling and an electrical coupling between the integrated circuit and the socket.

3. The electronic device of claim 1, wherein:
   the integrated circuit and the circuit board are positioned between the first plate and the second plate, and
   the force comprises a compression force.

4. The electronic device of claim 1, further comprising:
   a first thermal component thermally coupled to the integrated circuit; and
   a second thermal component thermally coupled to the circuit board.

5. The electronic device of claim 4, wherein the first thermal component comprises a vapor chamber, and the second thermal component comprises a fin stack.

6. The electronic device of claim 4, further comprising a voltage regulator, wherein:
   the circuit board comprises a first surface and a second surface opposite the first surface,
   the integrated circuit is located on the first surface,
   the voltage regulator is located on the second surface, and
   the second thermal component is thermally coupled to the voltage regulator.

7. An electronic device, comprising:
   a first thermal component, comprising:
      a holder, and
      a biasing component;
   a circuit board comprising a socket;
   an integrated circuit electrically coupled with the socket, the integrated circuit thermally coupled with the first thermal component;
   a plurality of plates coupled with the holder by a fastener, the plurality of plates providing a compression force, based on the fastener and the biasing component, to the integrated circuit and the circuit board; and
   a second thermal component thermally coupled to the circuit board, the second thermal component comprises a heat pipe that passes through a plate of the plurality of plates and into the first thermal component.

8. The electronic device of claim 7, wherein the first thermal component comprises a fin stack.

9. The electronic device of claim 7, wherein the plurality of plates comprises:
   a first plate; and
   a second plate, wherein the circuit board and the integrated circuit are positioned between the first plate and the second plate.

10. The electronic device of claim 9, wherein the first plate is carried by the first thermal component.

11. The electronic device of claim 10, further comprising a third thermal component positioned between the first thermal component and the first plate.

12. The electronic device of claim 9, wherein the second plate comprises an opening, and the fastener is positioned in the opening.

13. The electronic device of claim 7, further comprising a voltage regulator, wherein:
   the circuit board comprises a first surface and a second surface opposite the first surface,
   the integrated circuit is located on the first surface,
   the voltage regulator located on the second surface, and
   the second thermal component is thermally coupled to the voltage regulator.

14. An assembly comprising:
   a first fin stack, comprising:
      a holder,
      a fastener, and
      a biasing component that surrounds the holder;
   a circuit board comprising a socket configured to carry an integrated circuit such that the first fin stack is thermally coupled to the integrated circuit;
   a second fin stack thermally coupled to the circuit board;
   a plurality of plates configured to provide a compression force, based on the fastener and the biasing component, to the integrated circuit and the circuit board; and
   a heat pipe that passes through a plate of the plurality of plates and into the first fin stack.

15. The assembly of claim 14, wherein the plurality of plates comprises:
   a first plate; and
   a second plate, wherein the circuit board and the integrated circuit are positioned between the first plate and the second plate.

16. The assembly of claim 14, further comprising:
   a first vapor chamber thermally coupled to the integrated circuit; and
   a second vapor chamber thermally coupled to the second fin stack.

17. The assembly of claim 16, further comprising a voltage regulator carried by the circuit board, wherein the second vapor chamber is thermally coupled to the voltage regulator.

18. The assembly of claim 17, wherein:
the circuit board comprises a first surface and a second surface opposite the first surface,
the integrated circuit is located on the first surface, and
the voltage regulator located on the second surface.

19. The assembly of claim 16, wherein:
the plurality of plates comprise a first plate and a second plate, and
the first vapor chamber is positioned between the first plate and the integrated circuit.

* * * * *